(12) United States Patent
Chien et al.

(10) Patent No.: US 8,723,214 B2
(45) Date of Patent: May 13, 2014

(54) SUBMOUNT AND MANUFACTURING METHOD THEREOF

(75) Inventors: Wen-Cheng Chien, Hsinchu County (TW); Chia-Lun Tsai, Hsinchu County (TW)

(73) Assignee: Unistars Corporation, Hsinchu (TW)

( * ) Notice: Subject to any disclaimer, the term of this patent is extended or adjusted under 35 U.S.C. 154(b) by 189 days.

(21) Appl. No.: 13/150,034

(22) Filed: Jun. 1, 2011

(65) Prior Publication Data
US 2012/0091496 A1    Apr. 19, 2012

(30) Foreign Application Priority Data
Oct. 19, 2010  (TW) ............................... 99135494 A

(51) Int. Cl.
| H01L 33/00 | (2010.01) |
| H01L 23/495 | (2006.01) |
| H01L 23/10 | (2006.01) |
| H01L 23/34 | (2006.01) |
| H01L 27/15 | (2006.01) |

(52) U.S. Cl.
USPC ............... 257/99; 257/79; 257/675; 257/706; 257/717

(58) Field of Classification Search
USPC ............. 257/99, 729, 709, 712, 730–733, 59, 257/675, 676, 706, 717, 718, 720, 431, 451, 257/72, 79, 82, 88
See application file for complete search history.

(56) References Cited

U.S. PATENT DOCUMENTS

| 8,093,109 | B2 * | 1/2012 | Hirata et al. | .................. 438/151 |
| 2007/0200133 | A1 * | 8/2007 | Hashimoto et al. | ........... 257/100 |
| 2008/0105894 | A1 * | 5/2008 | Ishidu et al. | .................. 257/100 |
| 2008/0258171 | A1 * | 10/2008 | Tsukagoshi | ................... 257/100 |
| 2011/0104855 | A1 * | 5/2011 | Lin et al. | ....................... 438/118 |

* cited by examiner

Primary Examiner — Chuong A. Luu
(74) Attorney, Agent, or Firm — Ding Yu Tan

(57) ABSTRACT

A submount and a manufacturing method thereof are provided. The submount, on which at least a semiconductor die is disposed, is mounted on a circuit board. The submount includes a substrate made of a conductive material or a semiconducting material, a plurality of conductive film patterns, and an insulating film pattern. A surface of the substrate includes a die-bonding area and a plurality of conductive areas. The conductive film patterns are individually distributed in the respective conductive areas. The insulating film pattern is disposed between the conductive film pattern and the insulating film pattern, but is not disposed in the die-bonding area. Furthermore, the semiconductor die is disposed in the die-bonding area and is electrically connected with the conductive film patterns. Because the insulating film pattern is not being disposed in the die-bonding area of the submount, the submount structure has improved heat transfer efficiency.

11 Claims, 10 Drawing Sheets

SUBMOUNT AND MANUFACTURING METHOD THEREOF

FIELD OF INVENTION

The invention relates to a submount and a manufacturing method thereof, especially relates to a submount and a manufacturing method thereof in the field of the semiconductor packaging.

BACKGROUND OF THE INVENTION

With the rapid technological development in recent years, semiconductor technologies can be applied in more different technical fields, such as in logic computation (e.g. CPU), data storage (e.g. DRAM), and light emitting diode (LED). However, the increasing performances of the semiconductor devices are accompanied by more heat emissions thereof. Therefore, the heat transfer technology is becoming more and more important.

For example, in present time, the luminous efficiency and the brightness of the light emitting diode is accepted by the public, so that the light emitting diode is used widely for example in backlight assembly, car lamp, and street light, etc. However, with the increasing brightness, the larger amount of heat emission from the light emitting diode has become a troublesome issue in the industry. If the heat emission cannot be removed efficiently, the brightness of the light emitting diode will be decreased and the service life will become shorter.

Nowadays, the types of submounts used for packaging the LED device according to respective types of substrates can be divided into four categories: a print circuit board (PCB) substrate, a metal core print circuit board (MCPCB) substrate, a ceramic substrate, and a silicon substrate. In comparing these four types of submounts, the cost of the print circuit board substrate is the lowest, but its heat transfer efficiency is relatively poor. Furthermore, due to the corresponding technical limitations and cost burden, an insulating film residing on the silicon substrate is often relatively thin, so that dielectric breakdown can easily occur. The ceramic substrate is usually in the form of an $Al_2O_3$ substrate in the market, but the heat transfer efficiency of the $Al_2O_3$ substrate is poor. An AlN substrate, which is one type of ceramic substrate, has higher heat transfer efficiency, but its cost is higher.

Although the MCPCB substrate has higher heat transfer efficiency than the PCB substrate, the improvement of the heat transfer efficiency is still limited by a dielectric layer between a metal layer and a LED die.

Please refer to FIG. 1. FIG. 1 shows a front view of a traditional LED device assembly 100. The conventional LED device assembly 100 is disposed on a circuit board 10. The LED device assembly 100 includes a light emitting diode 110 and a conventional LED package 102. The LED package 102 includes a substrate 120, a reflector 130, and an insulator 140. The substrate 120 is a MCPCB substrate. The light emitting diode 110 and the reflector 130 are both disposed on the substrate 120. The reflector 130 defines a cup-shaped cavity 132. The light emitting diode 110 is disposed in the cavity 132. The sidewall of the cavity 132 has a relatively smooth reflective surface and is able to reflect the light emitting from the light emitting diode 110, so that the directivity of the light is improved. However, the reflector 130 and the substrate 120 are of two different elements, so that after an extended usage period, the reflector 130 may be dislocated or separated from the substrate 120.

In addition, a wire 112 and a wire 114 are connected with the light emitting diode 110. The wire 112 is connected to a positive conductive area 121 of the substrate 120, and the wire 114 is connected to a negative conductive area 122 of the substrate 120. The light emitting diode 110 is disposed in a die-mounting area 123 of the substrate 120. The positive conductive area 121, the negative conductive area 122, and the die-mounting area 123 are separated from each other by the insulators 140. The insulator 140 is formed in the holes of the substrate 120 by the injection of glue. Therefore, the holes should have a diameter larger than a predetermined diameter for allowing the glue injection to be performed in a smooth manner. However, this increases the width of the substrate 120, the distance between the positive conductive area 121 and the light emitting diode 120, and the distance between the negative conductive area 122 and the light emitting diode 120, thus the length of the wire 112 and the wire 114 have also to be increased. Furthermore, the LED device assembly 100 is electrically connected with the circuit board 10 by using a wire bonding method, so that the occupied area of the LED device assembly 100 on the circuit board 10 is increased.

Hence, there is a need in the art for providing a submount used for packaging the LED device or other semiconductor device, thereby having higher heat transfer efficiency, a longer service life, and a smaller occupied area.

SUMMARY OF THE INVENTION

One aspect of the invention is to provide a submount and a manufacturing method thereof The submount has improved heat transfer efficiency, a longer service life, and a smaller occupied area.

To achieve the foregoing and other aspects, a submount is provided. The submount is disposed on a circuit board, and at least a semiconductor die is mounted on the submount. The submount includes a substrate, a plurality of conductive film patterns, and an insulating film pattern. The substrate is made of a conductive or semiconducting material, and a surface of the substrate includes a die-mounting area and a plurality of conductive areas. The conductive film patterns are each disposed on the respective conductive areas. The insulating film pattern is located between the conductive film patterns and the substrate, and is not disposed in the die-mounting area. The semiconductor die is mounted in the die-mounting area, and is electrically connected with the conductive film patterns.

In the submount, the semiconductor die is a light emitting diode. The conductive areas include a first conductive area and a second conductive area. The conductive film patterns include a first conductive film pattern and a second conductive film pattern. The first conductive film pattern and the second conductive film pattern are each disposed in the first conductive area and the second conductive area, respectively. In addition, the first conductive film pattern and the second conductive film pattern are not in contact with each other.

In the submount, a plurality of through holes is formed in the substrate. The through holes are passed through the substrate, and each through hole is disposed in a respective conductive area. The conductive films are disposed on the side walls of the through holes.

In the submount, the substrate further includes a cavity. The cavity is located in the die-mounting area, and is formed integrally on the substrate. The semiconductor die is located in the cavity.

In the submount, the conductive film patterns further includes a third conductive film pattern, and the third conductive film pattern is located in the die-mounting area. The third conductive film pattern is contacted with the substrate directly. Furthermore, the third conductive film pattern is electrically connected with the second conductive film pattern. One electrode of the semiconductor die is contacted with the third conductive film pattern directly. Another electrode of the semiconductor die is connected to the first conductive film via a first wire.

In the submount, the material of the substrate can be copper, aluminum, or an alloy including copper or aluminum, or the material of the substrate can also be a semiconducting material, for example, silicon. The material of the conductive film pattern is substantially comprised of copper, nickel, aurum, silver, or an alloy including at least one of the above metals.

In the submount, the material of the insulating film pattern is a polymer, for example: epoxy resin, silicone, polyimide, and solder mask. Furthermore, the insulating film is preferably larger than 2 µm.

In the submount, the submount is electrically connected with the circuit board by using surface mounting technology.

To achieve the foregoing and other aspects, a manufacturing method of a submount is provided. The manufacturing method includes the following steps:

(a) A substrate, substantially made of a conductive or semiconducting material, is provided. The substrate has a plurality of through holes. A surface of the substrate includes a die-mounting area and a plurality of conductive areas.

(b) An insulating film pattern is formed on the substrate by using an electrochemical plating method, an electrophoresis method, or an electrochemical deposition method, and the insulating film pattern is not disposed in the die-mounting area.

(c) A plurality of conductive film patterns is formed and is individually disposed in the respective conductive areas.

(d) A semiconductor die is mounted in the die-mounting area.

(e) The semiconductor die is electrically connected with the conductive film patterns.

Because the insulating film pattern is not disposed in the die-mounting area of the submount, the submount has improved heat transfer efficiency.

DETAILED DESCRIPTION OF THE INVENTION

Figure 2A:
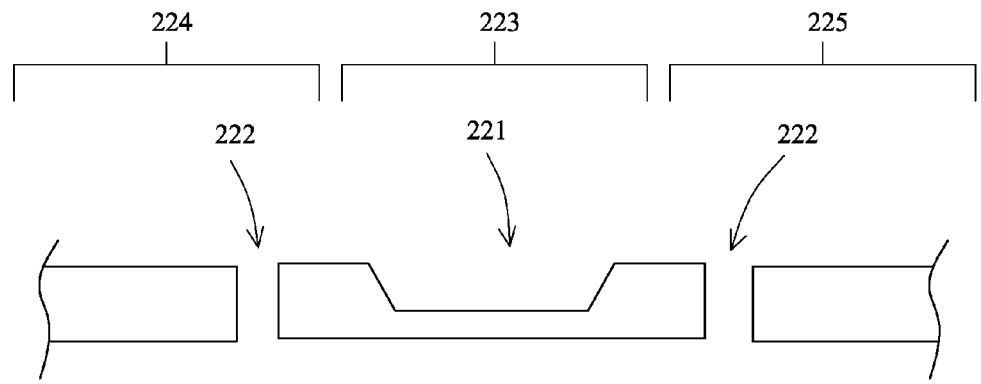
FIG. 2A~FIG. 2E show a manufacturing method of a LED device package assembly of an embodiment in the invention.

Please refer to FIG. 2A~FIG. 2E in which an embodiment of a manufacturing method of a LED device package assembly in the present invention is shown. First, as shown in FIG. 2A, a substrate 220 substantially made of copper is provided. A cavity 221 and a plurality of through holes 222 (there are two through holes in this embodiment) are formed in the substrate 220. The cavity 221 is formed integrally on the substrate 220, and the through holes 222 are passed through the substrate 220. A surface of the substrate 220 is divided into a die-mounting area 223, a first conductive area 224, and a second conductive area 225. The cavity 221 is located in the die-mounting area 223. The two through holes 222 are each located on the first conductive area 224 and the second conductive area 225, respectively. The definitions of the die-mounting area 223, the first conductive area 224, and the second conductive area 225 will be described in more details in the following texts.

Figure 2B:
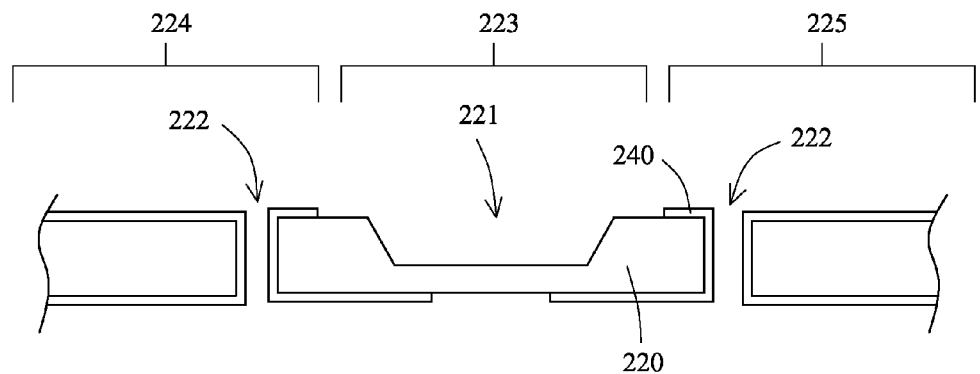

Then, please refer to FIG. 2B, an insulating film pattern 240 is formed on the substrate 220 by using an electrochemical plating method, an electrophoresis method, or an electrochemical deposition method. The die-mounting area 223 of the substrate 220 is not covered by the insulating film pattern 240. The electrochemical plating method, the electrophoresis method, or the electrochemical deposition method is utilized to apply a voltage on the substrate 220 and make the substrate 220 to be positively or negatively charged, so that a plurality of particles or ions having opposite charges are deposited on the substrate 220. As well known by a person skilled in the art, the electrochemical plating method, the electrophoresis method, and the electrochemical deposition method are therefore not described in detail in this description. Compared with the conventional sputtering deposition method, the anodic oxidation method or thermal oxidation method, the electrochemical plating method, the electrophoresis method, or the electrochemical deposition method used in the manufacturing method of this embodiment has higher deposition rate, and can deposit a thicker insulating film pattern 240 in a shorter time. In this embodiment, the insulating film pattern 240 is larger than 2 µm, and is preferably larger than 5 µm. Because the insulating film pattern 240 has larger thickness, the dielectric breakdown is not as easy to occur.

Figure 2C:
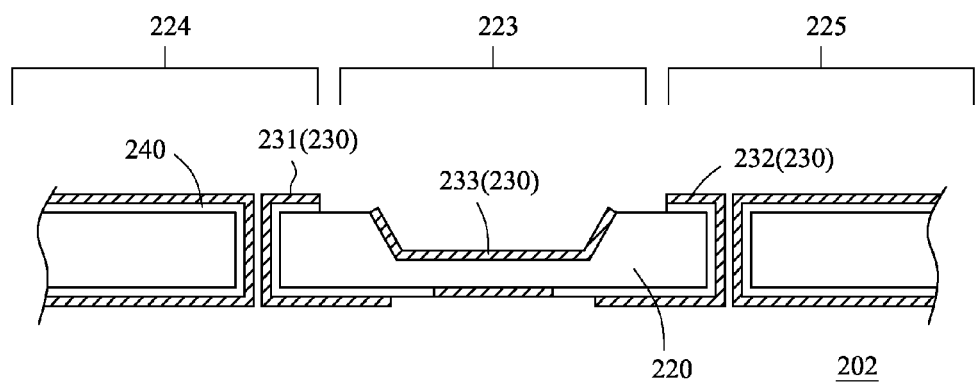

Thereafter, please refer to FIG. 2C, a plurality of conductive film patterns 230, including a first conductive film pattern 231, a second film pattern 232, and a third conductive film pattern 233, is formed. At this stage, the manufacturing process of a submount 202 is complete. The first conductive film pattern 231 and the second conductive film pattern 232 are each disposed on the first conductive area 224 and the second conductive area 225 of the substrate 220, respectively. The third conductive film pattern 233 is disposed in the die-mounting area 223. From FIG. 2C, a person skilled in the art should understand that the first conductive film pattern 231 and the second conductive film pattern 232 are covered on the insulating film pattern 240, and the first conductive film pattern 231, the second conductive film pattern 232, and the third conductive film pattern 233 are not in contact with each other.

Please refer to FIG. 2A and FIG. 2C, the first conductive area 224 of the substrate 220 is covered by the first conductive film pattern 231, the second conductive area 225 of the substrate 220 is covered by the second conductive film pattern 232, and the die-mounting area 223 is located between the first conductive area 224 and the second conductive area 225.

Furthermore, in this embodiment, the insulating film pattern 240 is not disposed in the die-mounting area 223.

Figure 2D:
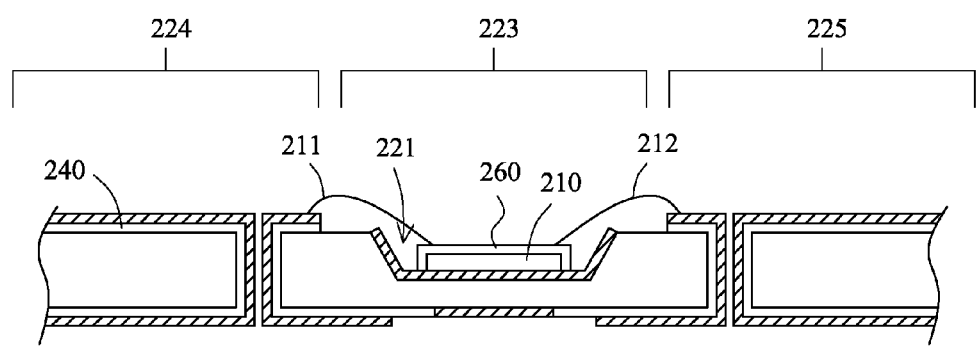
Figure 2E:
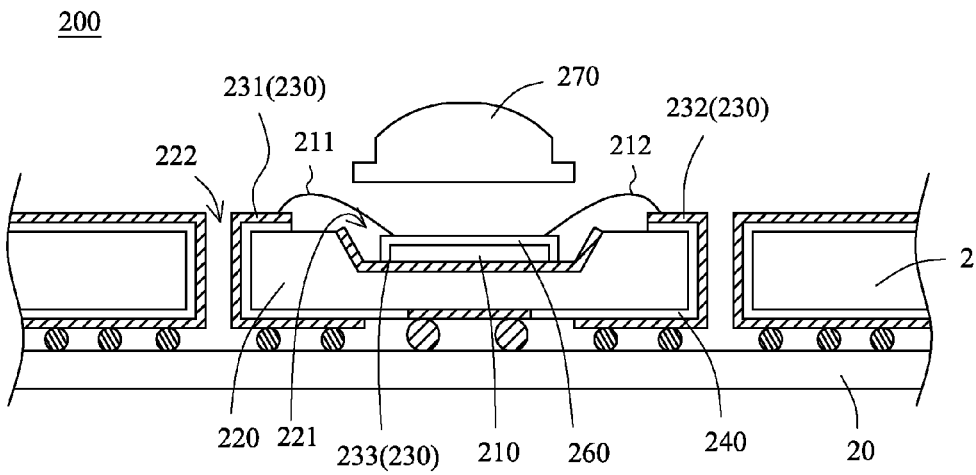

Thereafter, please refer to FIG. 2D. A light emitting diode 210 is mounted in the cavity 221. Then, a first wire 211 is connected between the light emitting diode 210 and the first conductive film pattern 231, and a second wire 212 is connected between the light emitting diode 210 and the second conductive film pattern 232. In addition, a photoluminescence phosphor layer 260 is disposed on the light emitting diode 210. Please refer to FIG. 2E, a lens 270, which is formed by an injection of glue, is mounted above the light emitting diode 210. Then, the manufacturing process of a LED package assembly 200 is complete.

Figure 3A:
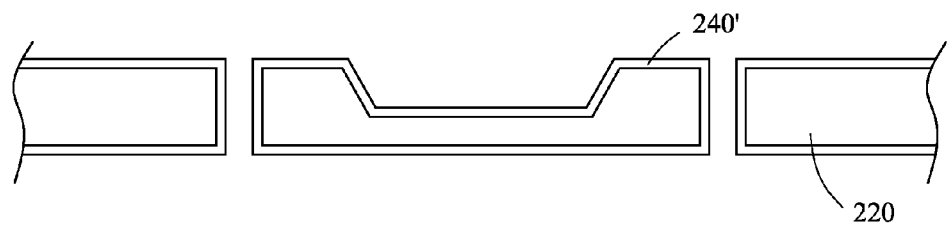
FIG. 3A~FIG. 3C show a manufacturing process of the insulating film pattern in one embodiment.
Figure 3B:
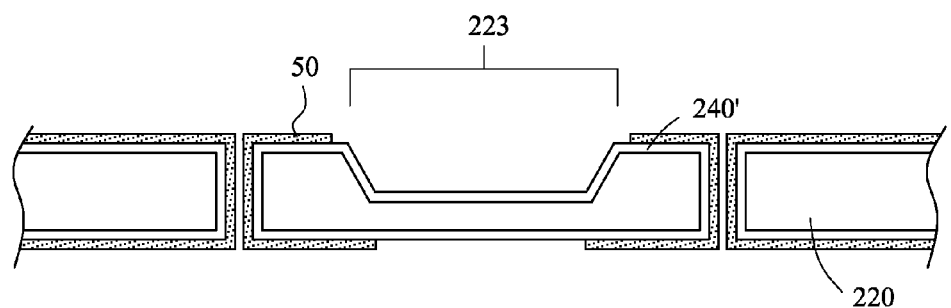
Figure 3C:
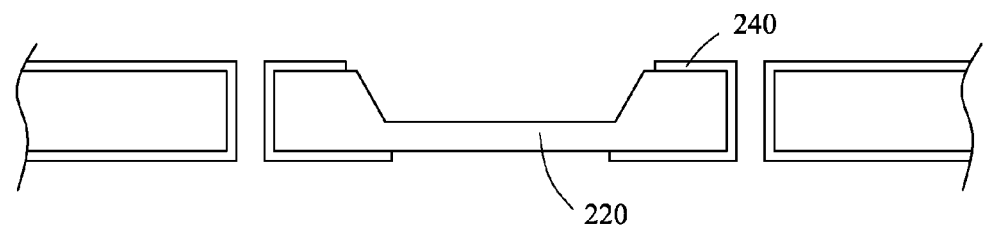

The manufacturing process of the insulating film pattern 240 is described in more detail in the following texts. Please refer to FIG. 3A~FIG. 3C in which a manufacturing process of the insulating film pattern 240 in one embodiment is shown. First, please refer to FIG. 3A, an insulating film 240' is disposed on the substrate 220 by using the electrochemical plating method, the electrophoresis method, or the electrochemical deposition method. In this embodiment, the material of the insulating film 240' is a polymer, for example: epoxy resin, silicone, polyimide, or solder mask. Then, please refer to FIG. 3B. A photoresist layer 50 is disposed on the insulating film 240', but the insulating film 240' on the die-mounting area 223 is not covered by the photoresist layer 50. Thereafter, an etching process is performed. The portion of the insulating film 240' not covered by the photoresist layer 50 is removed. Next, the photoresist layer 50 is removed, and the insulating film pattern 240 is formed.

Figure 4A:
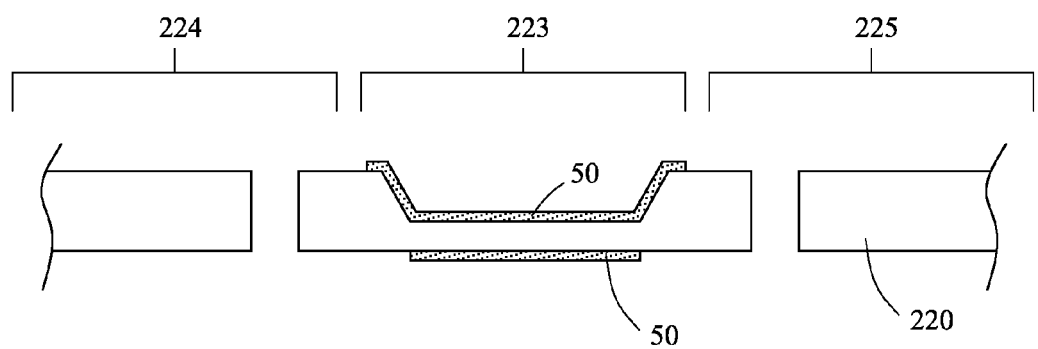
FIG. 4A~FIG. 4C show a manufacturing process of the insulating film pattern in another embodiment.
Figure 4B:
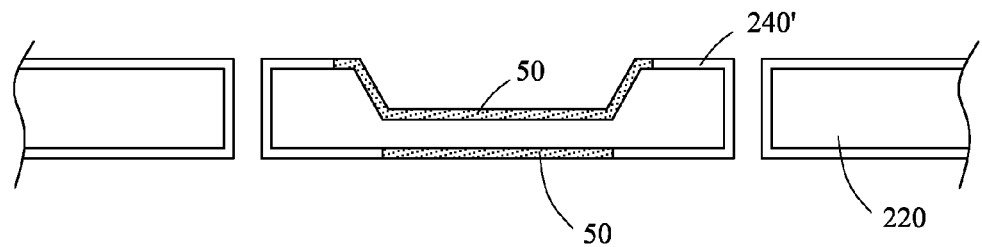
Figure 4C:
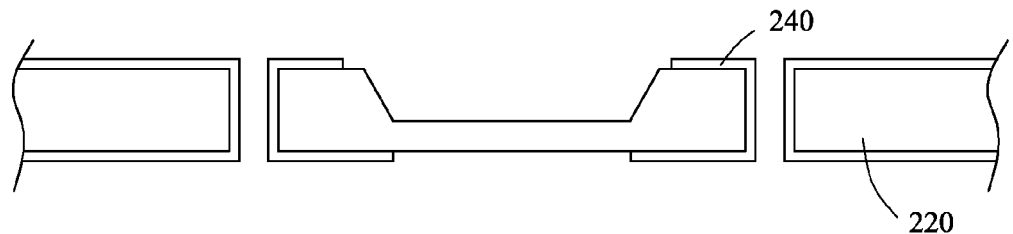

Please refer to FIG. 4A~FIG. 4C in which a manufacturing process of the insulating film pattern in another embodiment is shown. The photoresist layer 50 is disposed in the region in which the insulating film pattern 240 would not to be later disposed within (for example: the die-mounting area 223 in FIG. 4A). Then, as shown in FIG. 4B, the insulating film 240' is disposed on the substrate 220 by using the electrochemical plating method, the electrophoresis method, or the electrochemical deposition method. Because the insulating film 240' cannot be formed on the photoresist layer 50, the insulating film pattern 240 is therefore formed after the photoresist layer 50 is removed.

Figure 5A:
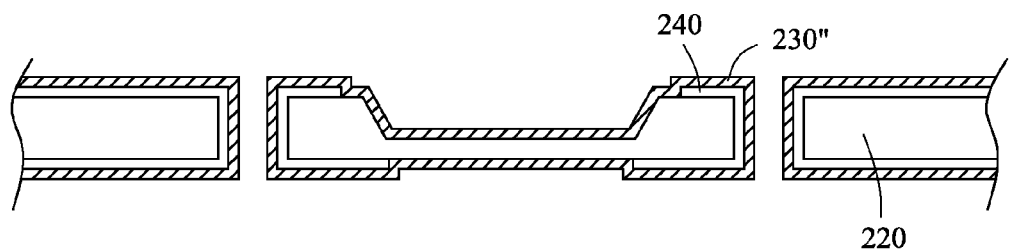
FIG. 5A~FIG. 5D show one embodiment of the manufacturing process of the conductive film pattern.
Figure 5B:
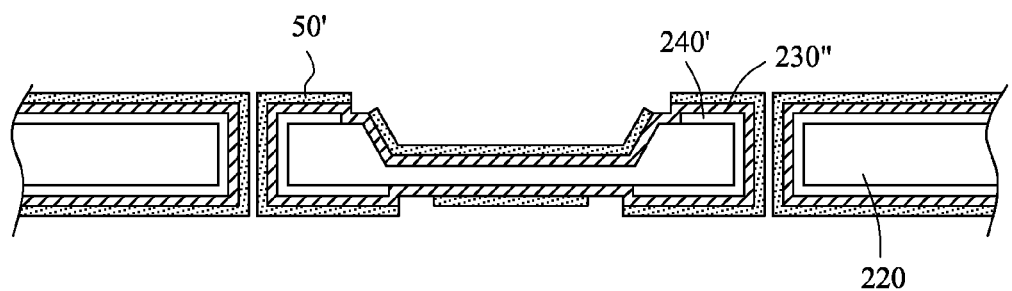
Figure 5C:
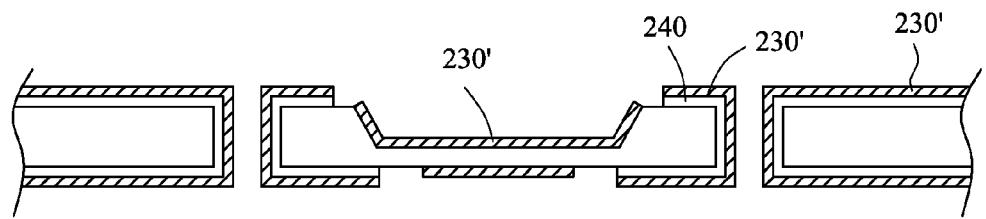
Figure 5D:
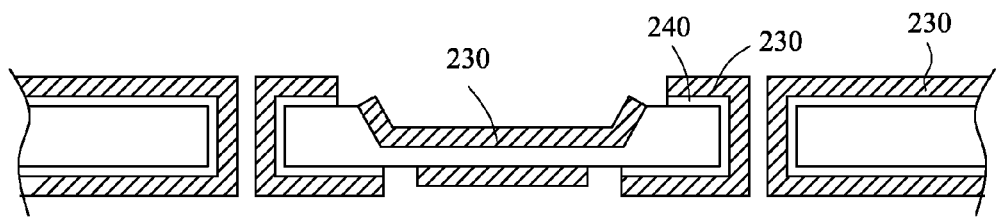

The manufacturing process of the conducting film pattern 230 is described in more detail in the following texts. Please see FIG. 5A~FIG. 5D in which one embodiment of the manufacturing process of the conductive film pattern is shown. First, please refer to FIG. 5A. A seed layer 230" is formed on the substrate 220. The seed layer 230", made of copper, is disposed over the entire surface of the substrate 220 and directly covers the entire insulating film pattern 240. In this embodiment, the seed layer 230", made of copper, is formed by an immersion plating method or a sputtering method. Then, please refer to FIG. 5B, a photoresist layer 50' is disposed on the seed layer 230", and some part of the seed layer 230" is not covered by the photoresist layer 50'. Next, an etching process is performed. The portion of the seed layer 230" not covered by the photoresist layer 50' is removed, and the seed layer pattern 230' (as shown in FIG. 5C) is formed. After the photoresist layer 50' is removed, the deposition of copper on the seed layer pattern 230' is performed by using the electrochemical plating method, the electrophoresis method, or the electrochemical deposition method, in order to form the conductive film pattern 230 as shown in FIG. 5D. In addition, a person skilled in the art should understand that other types of metal, for example: nickel, aurum, and silver, can be deposited after the deposition of copper, in order to enhance the physical characteristics of the conductive film patterns 230.

Figure 6A:
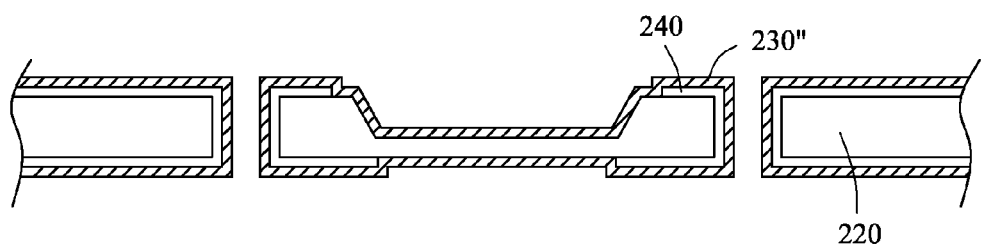
FIG. 6A~FIG. 6D shows another embodiment of the manufacturing process of the conductive film pattern.
Figure 6B:
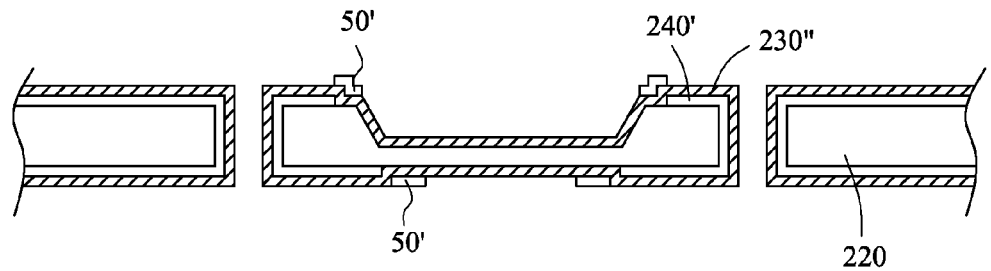
Figure 6C:
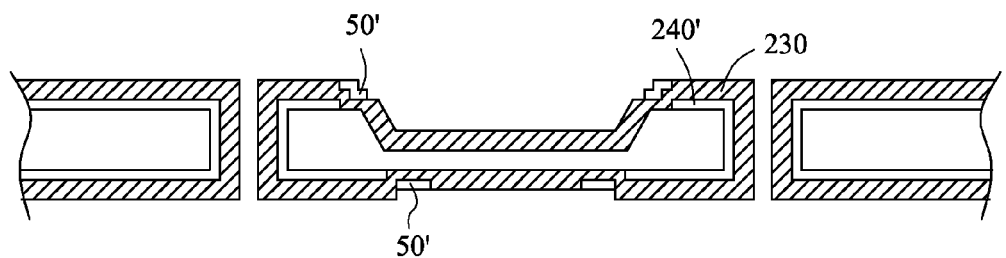
Figure 6D:
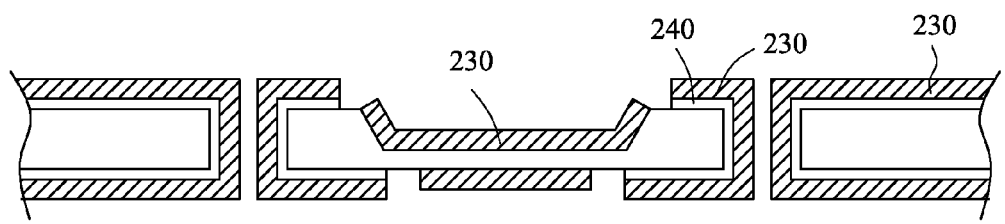

The process as shown in FIG. 5A~FIG. 5D is not the only one possible embodiment for the manufacturing of the conductive film pattern 230. Please refer to FIG. 6A~FIG. 6D. FIG. 6A~FIG. 6D shows another embodiment of a manufacturing process of the conductive film pattern 230. First, as shown in FIG. 6A, a seed layer 230", made of copper, is disposed on the substrate 220 and covers the entire insulating film pattern 240. Then, as shown in FIG. 6B, a photoresist layer 50' is disposed on the seed layer 230", but some parts of the seed layer 230" are not covered by the photoresist layer 50'. Thereafter, by using the electrochemical plating, the electrophoresis, or the electrochemical deposition, copper and other metal (for example: nickel and aurum) are deposited on, and thereby increase the thickness of the part of the seed layer 230" that is not covered by the photoresist layer 50', to form the conductive film pattern 230. Next, the photoresist layer 50' is removed, and an etching process is performed for removing the seed layer 230" left behind, so as to form the conductive film patter 230 shown in FIG. 6D.

It should be noted that FIG. 5A~FIG. 5D and FIG. 6A~FIG. 6D are only in the form of illustrative schematic diagrams, and therefore, are not shown in actual scale. For example, the conductive film pattern 230 is much thicker than the seed layer pattern 230' or the seed layer 230". In general, the thicknesses of the seed layer pattern 230' or the seed layer 230" are smaller than 1 µm, and the thickness of the conductive film pattern 230 is larger than 10 µm. In other embodiments, a conductive film is directly disposed on the seed layer 230" by using electrochemical plating, electrophoresis, or the electrochemical deposition; thereafter, a photoresist layer is disposed on the conductive film, and an etching process is performed, to form the conductive film pattern 230.

Figure 7A:
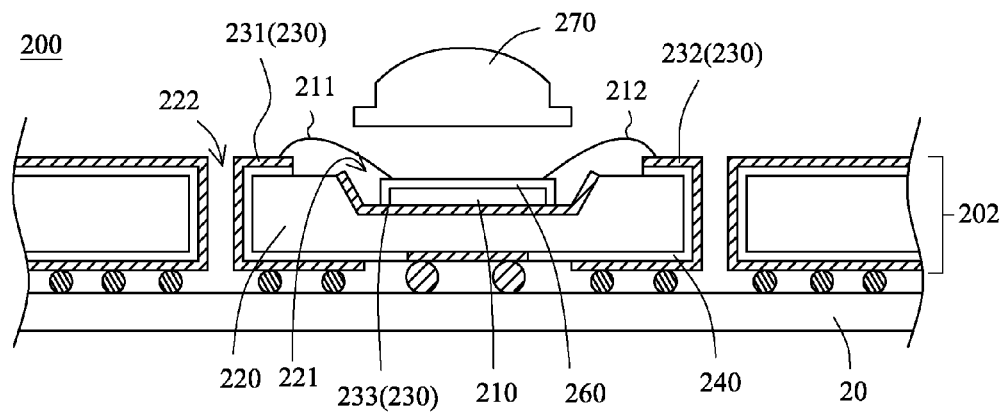
FIG. 7A and FIG. 7B each show a sectional view and a top view of a LED device package assembly of a first embodiment in the invention.
Figure 7B:
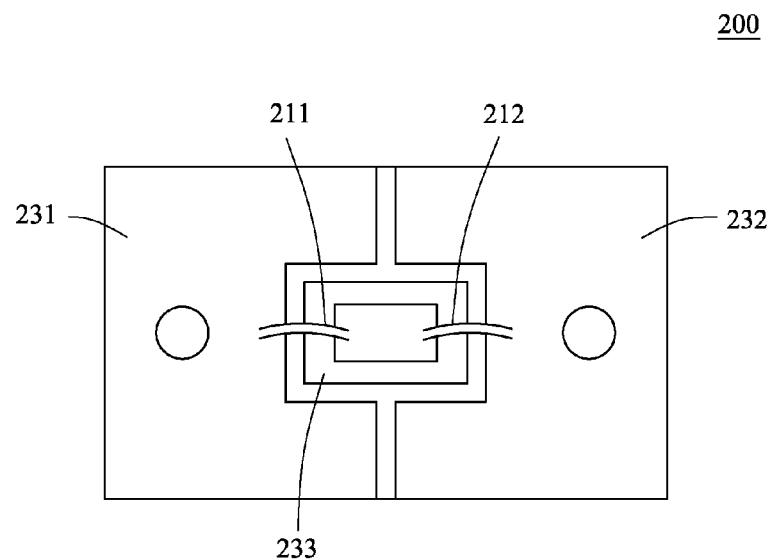

FIG. 7A and FIG. 7B show a LED device package assembly 200 of a first embodiment in the present invention. FIG. 7A shows the sectional view, and FIG. 7B shows the top view of the first embodiment. The LED device package assembly 200 is produced by the manufacturing method shown in FIG. 2A~FIG. 2D, and is mounted on a circuit board 20. The circuit board 20 is for example, a printed circuit board. Besides of the LED device package assembly 200, other types of electronic device (not shown) or more than one LED device package assembly 200 can also be mounted on the circuit board 20.

From FIG. 7A, a person skilled in the art should understand that the insulating film pattern 240 is not disposed under the light emitting diode 210. Because the third conductive film 233 is made of copper, nickel, aurum, or silver and other metal and the substrate 220 is made of copper, the heat emission from the light emitting diode 210 can be transferred out of the third conductive film pattern 233 and the substrate 220, thus the light emitting diode 210 is less likely to be overheated. The photoluminescence phosphor layer 260 disposed on the light emitting diode 210 is used to control the color of the light of the LED device package assembly 200. For instance, when the color of the emitting light from the light emitting diode 210 is blue and the photoluminescence phosphor layer 260 is made of yellow photoluminescence phosphors, the color of the emitting light from the LED device package assembly 200 is thereby white.

Figure 1:
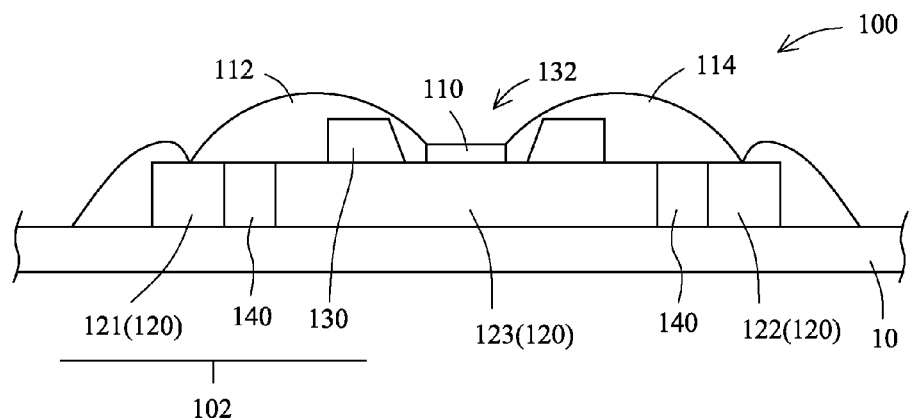
FIG. 1 shows a front view of a traditional LED device.

Because the cavity 221 is formed integrally on the substrate 220 the problem of the dislocation or separation between the reflector 130 and the substrate 120 of the LED device package assembly 100 in FIG. 1 will not be encountered in LED device package assembly 200. Therefore, the service life of the LED device package assembly 200 as described in the first embodiment of present invention is longer than the conventional LED device assembly 100.

The third conductive film 233 disposed on the side wall of the cavity 221 has a higher reflectivity, so that the light emitting from the light emitting diode 210 can be reflected by the third conductive film 233. In addition, the lens 270 is used to condense the light. These factors combined together all assist to increase the illumination quality of the LED device package assembly 200.

Please refer to FIG. 1, FIG. 7A, and FIG. 7B. Unlike the conventional submount 102, there is no need for having the insulator 140 in the substrate 220, so that the substrate 220 occupies a smaller area, and the first wire 211 and the second wire 212 are each shorter than the wire 112 and the wire 114 respectively, thus the LED device package assembly 200 occupies a smaller area. Furthermore, the conventional submount 102 is connected with the circuit board 10 by using wire bonding, but the submount 202 is connected with the circuit board 20 by using surface mount technology. Thus, when comparing FIG. 1 and FIG. 7A, it can be seen that the occupied area of the LED device package assembly 200 on the circuit board 20 is smaller than that of the LED device package assembly 100 on the circuit board 10. Because the LED device package assembly 200 has the smaller occupied area on the circuit board 20, and other types of electronic components or more than one LED device package assembly 200 can be mounted on the circuit board 20.

In the above embodiments, the die-mounting area 223 is located in the center area of the substrate 220. However, a person skilled in the art should understand that the die-mounting area 223 is not limited to be disposed in the center area of the substrate 220. The material of the substrate 220 is copper in the above embodiment, but the substrate 220 can be made of other material, for example: aluminum or alloy including copper or aluminum. The substrate 220 can also be made of semiconductor material such as silicon, or of other material that can enable the substrate 220 to take on conductive properties. In addition, the die-mounting area 223 can be a flat surface without any cavity 221.

Figure 8A:
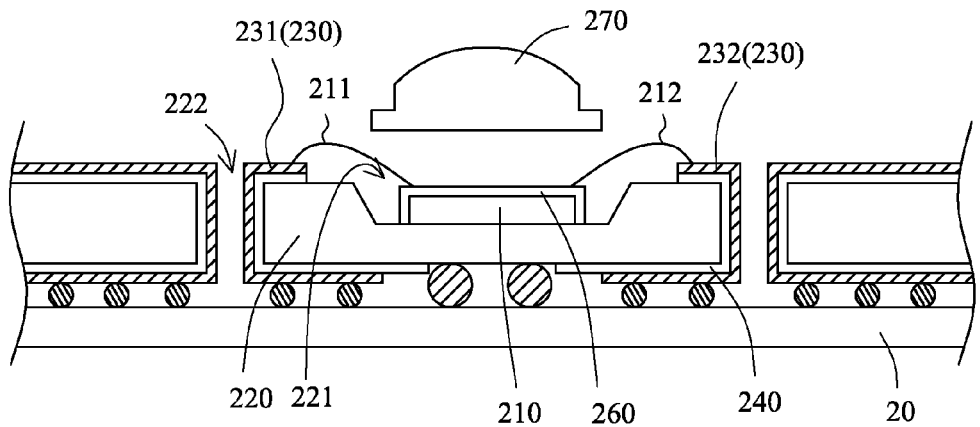
FIG. 8A shows a LED device package assembly of a second embodiment in the invention.

Please refer to FIG. 8A. FIG. 8A shows a LED device package assembly 200' of a second embodiment in the present invention. Unlike the LED device package assembly 200 shown in FIG. 7A, the LED device package assembly 200' does not have any third conductive film pattern 233 disposed thereof, i.e. the light emitting diode 210 is directly contacted with the substrate 220.

Figure 8B:
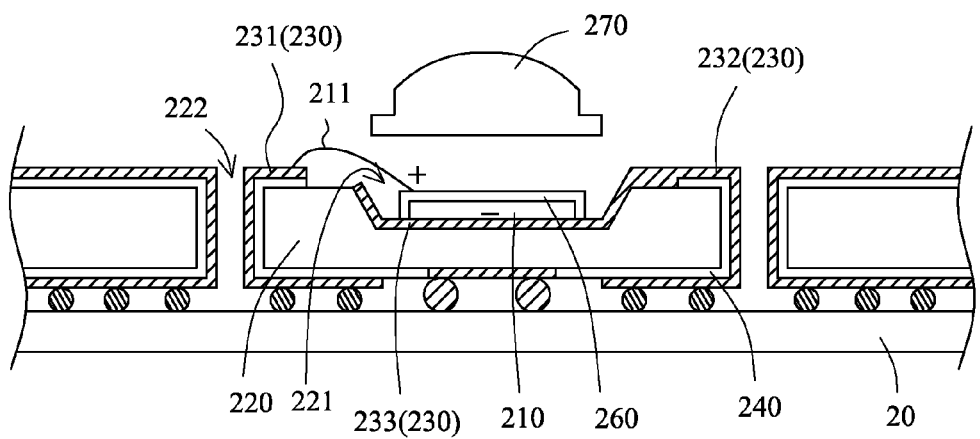
FIG. 8B shows a LED device package assembly of a third embodiment in the invention.

In FIG. 7A, the first conductive film pattern 231, the second conductive film pattern 232, and the third conductive film pattern 233 are not in contact with each other. And the light emitting diode 210 is electrically connected with the first conductive film pattern 231 and the second conductive film pattern 232 by wire bonding method. However, in FIG. 8B, a LED device package assembly 200'' of a third embodiment in the invention is shown, in which the second conductive film pattern 232 and the third conductive film pattern 233 are formed integrally. In other words, the second conductive film pattern 232 and the third conductive film pattern 233 are connected together. Furthermore, in the LED device 200'', one electrode (e.g. positive electrode) of the light emitting diode 210 is directly contacted with the third conductive film pattern 233, and another electrode (e.g. negative electrode) of the light emitting diode 210 is electrically connected with the first conductive film pattern 231 via the first wire 211.

Figure 9:
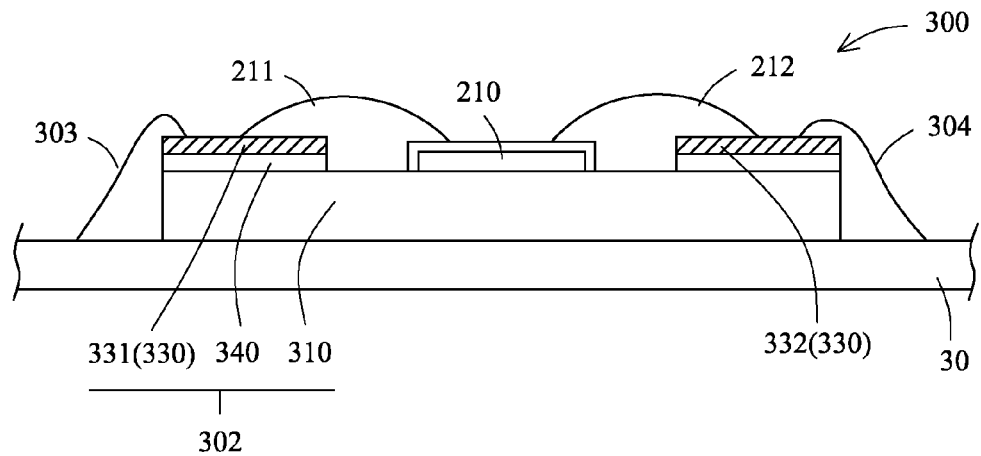
FIG. 9 shows a LED device package assembly of a fourth embodiment in the invention.

Please refer to FIG. 9. FIG. 9 shows a LED device package assembly 300 of a fourth embodiment in the present invention. A submount 302 of a LED device package assembly 300 is mounted on a circuit board 30. Unlike the submount 202 in FIG. 7A, a substrate 310 of the submount 302 does not have any cavity 221 nor any through hole 222 disposed thereon. The LED device package assembly 300 further includes a third wire 303 and a fourth wire 304. The third wire 303 is connected between a first conductive film pattern 331 and the circuit board 30, and the fourth wire 304 is connected between a second conductive film pattern 331 and the circuit board 30.

Because the surface of the substrate 310 is a flat surface without having any cavity 221 and through holes 222 therein, besides of electrochemical plating, electrophoresis, or electrochemical deposition method, person of ordinary skill in the art can also use a printing method, a sputtering deposition method, or a spraying method to form an insulating film pattern 340 and a conductive film pattern 330 on the substrate 310.

Figure 10:
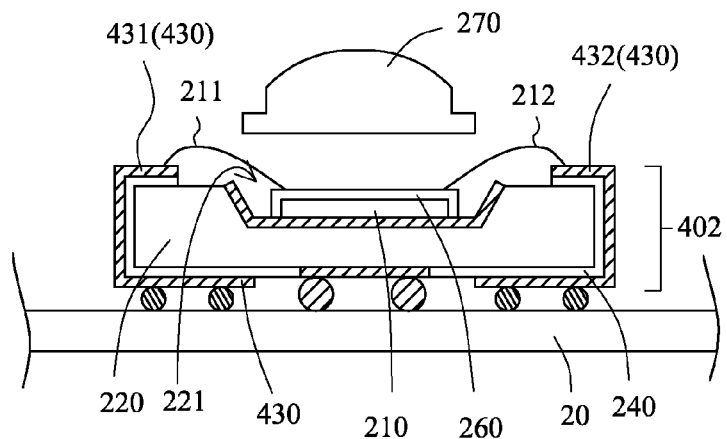
FIG. 10 shows a LED device package assembly of a fifth embodiment in the invention.

Please refer to FIG. 10. FIG. 10 shows a LED device package assembly 400 of a fifth embodiment in the present invention. A submount 402 of the LED device package assembly 400 is mounted on the circuit board 20. Unlike the submount 202 in FIG. 7A, a substrate 410 of the LED device package assembly 400 has no through hole formed therein. Besides being disposed on the upper surface and the lower surface of the substrate 410, a first conductive film pattern 431 and a second conductive film pattern 432 are also disposed on the side wall of the substrate 410. Thus, the conductive film pattern 430 on the upper surface is electrically connected with the conductive film pattern 430 on the lower surface via the conductive film pattern 430 on the side wall. In this embodiment, the submount 402 is electrically connected with the circuit board 20 by using surface mount technology.

In the above embodiment, only one light emitting diode is disposed in the LED device package assembly. The person of ordinary skill in the art can also add more light emitting diodes depending upon the circumstances. These light emitting diodes are electrically parallel connected with each other.

In addition, besides being used along with the light emitting diode, the submount can also be adapter for usage in other kinds of semiconductor package structure. In other words, other types of semiconductor die, for example: a logic IC, a memory IC, an analog IC, or a CMOS sensor can be mounted on the die-mounting area of the submount. The quantity of the conductive film patterns is varied according to the type of the mounted semiconductor die, and mainly depending on the number of pins of the semiconductor die. For example, if the number of the pins is a total of ten, the corresponding number of the conductive film will also be ten. Because the insulating film pattern is not disposed in the die-mounting area of the submount, the semiconductor package structure using the submount has improved heat transfer efficiency.

Although the description above contains many specifics, these are merely provided to illustrate the invention and should not be construed as limitations of the invention's scope. Thus it will be apparent to those skilled, in the art that various modifications and variations can be made in the system and processes of the present invention without departing from the spirit or scope of the invention.

What is claimed is:

1. A submount, disposed on a circuit board, at least a semiconductor die mounted on the submount, and the submount comprising:
    a substrate, the substrate made of a conductive material or a semiconducting material, a surface of the substrate comprising a die-mounting area and a plurality of conductive areas;

a plurality of conductive film patterns, each conductive film pattern being disposed in one respective conductive area; and an insulating film pattern, the insulating film pattern located between the conductive film patterns and the substrate, and the insulating film pattern being not disposed in the die-mounting area, wherein the semiconductor die is mounted on the die-mounting area, and is electrically connected with the conductive film patterns, a plurality of through holes is formed in the substrate, the through holes are passed through the substrate and formed in the respective conductive areas, the conductive films and the insulating film pattern are disposed on the side walls of the through holes, and the submount is electrically connected with the circuit board by using the surface mounting technology, the semiconductor die is a light emitting diode, the conductive areas comprise a first conductive area and a second conductive area, the conductive film patterns comprise a first conductive film pattern and a second conductive film pattern, the first conductive film pattern and the second conductive film pattern are each disposed on the first conductive area and the second conductive area, respectively, and the first conductive film pattern and the second conductive film pattern are not in contact with each other, the substrate further comprises a cavity, the cavity is located in the die-mounting area and formed integrally on the substrate, and the semiconductor die is located in the cavity.

2. The submount of claim 1, wherein the conductive film patterns further comprise a third conductive film pattern, the third conductive film pattern is located in the die-mounting area, and the third conductive film pattern is contacted with the substrate directly.

3. The submount of claim 2, wherein the third conductive film pattern is electrically connected with the second conductive film pattern, one electrode of the semiconductor die is directly contacted with the third conductive film pattern, and another electrode of the semiconductor die is electrically connected with the first conductive film pattern via a first wire.

4. The submount of claim 1, wherein the material of the substrate is copper, aluminum, or an alloy comprising at least one of copper and aluminum.

5. The submount of claim 1, wherein the material of the substrate is silicon.

6. The submount of claim 1, wherein the material of the conductive film pattern is substantially comprised of copper, nickel, aurum, silver, or an alloy comprising at least one of copper, nickel, aurum, and silver.

7. The submount of claim 1, wherein the material of the insulating film pattern is a polymer.

8. The submount of claim 7, wherein the material of the insulating film pattern is epoxy resin, silicone, polyimide, or solder mask.

9. The submount of claim 1, wherein the thickness of the insulating film is larger than 2 μm.

10. The submount of claim 1, wherein a first wire and a second wire are connected with the semiconductor die, the first wire is connected between the first conductive film pattern and the semiconductor die, and the second wire is connected between the second conductive film pattern and the semiconductor die.

11. The submount of claim 1, wherein the conductive film pattern is disposed on the side wall of the substrate.

* * * * *